United States Patent
Pang et al.

(10) Patent No.: US 7,538,340 B2
(45) Date of Patent: May 26, 2009

(54) LOW SIDE EMITTING LIGHT SOURCE AND METHOD OF MAKING THE SAME

(75) Inventors: Siew It Pang, Bayan Lepas (MY); Tong Fatt Chew, Taman Sri Nibong (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 150 days.

(21) Appl. No.: 11/566,190

(22) Filed: Dec. 1, 2006

(65) Prior Publication Data

US 2008/0128714 A1    Jun. 5, 2008

(51) Int. Cl.
*H01L 31/00* (2006.01)
*F21V 7/04* (2006.01)
*G02F 1/1333* (2006.01)
*H01L 21/00* (2006.01)

(52) U.S. Cl. ............... 257/21; 257/13; 257/76; 257/85; 257/98; 257/99; 257/E31.009; 257/E31.097; 438/22; 438/23; 438/25; 438/29; 362/609; 362/612; 362/615; 362/632; 349/60; 349/69; 349/98

(58) Field of Classification Search .......... 257/13, 257/21, 76, 85, 98, 99, E31.009, E31.097; 438/22, 23, 25, 29; 362/609, 612, 615, 629, 362/632; 349/60, 69, 96
See application file for complete search history.

(56) References Cited

U.S. PATENT DOCUMENTS

| | | | |
|---|---|---|---|
| 7,088,485 B2 * | 8/2006 | Suzuki | 359/204 |
| 2007/0075306 A1 * | 4/2007 | Hayashi et al. | 257/13 |
| 2007/0121343 A1 * | 5/2007 | Brown | 362/612 |
| 2007/0263408 A1 * | 11/2007 | Chua | 362/612 |

* cited by examiner

*Primary Examiner*—Long K Tran (57) ABSTRACT

A light source having a die, a substrate, and a housing is disclosed. The die has a semiconducting light emitting device thereon, the die having a top surface and a bottom surface, light being emitted through the top surface. The die is characterized by a maximum dimension. The substrate has a top surface bonded to the bottom surface of the die. The substrate includes a plurality of electrical traces connected to the die that are used to power the light emitting device. The housing includes a reflector having a reflective inner wall facing the die and an aperture through which light reflected from the inner wall exits the housing. The aperture lies in a plane normal to the top surface of the die and has a height that is less than the maximum dimension of the die. The die is encapsulated in a transparent layer of material.

8 Claims, 7 Drawing Sheets

LOW SIDE EMITTING LIGHT SOURCE AND METHOD OF MAKING THE SAME

BACKGROUND OF THE INVENTION

Light emitting diodes (LEDs) are attractive candidates for replacing conventional light sources such as incandescent lamps and fluorescent light sources. The LEDs have higher light conversion efficiencies and longer lifetimes than the conventional sources. LEDs are particularly attractive candidates for light sources that are utilized in back-lit displays based on thin extended light sources that are placed behind a transparent object that is illuminated. Such displays are routinely used in handheld devices such as cellular telephones, laptop computers, and PDAs. The illumination system typically utilizes some form of light box or light pipe behind a transparency that could be a fixed scene or a liquid crystal display (LCD) panel. Light is injected into this light box at the periphery of the light box. The surface of the light box opposite to the surface that is adjacent to the transparency has some form of scattering center that scatters the light so that the back surface of the LCD is uniformly illuminated.

The thickness of the light source is limited by the thickness of the light box. The thickness of the display is particularly important in displays used for laptop computers and handheld devices such as PDAs and cellular telephones, as the display thickness limits the overall thickness of the device. Some of these portable devices require light boxes that are less than 1 mm thick. As the thickness of the light box is reduced, the efficient injection of light into the light box from the sides in a manner that assures uniform illumination and high efficiency becomes more difficult.

SUMMARY OF THE INVENTION

The present invention includes a light source having a die, a substrate, and a housing. The die has a semiconducting light emitting device thereon, the die having a top surface and a bottom surface, light being emitted through the top surface. The die is characterized by a maximum dimension. The substrate has a top surface bonded to the bottom surface of the die. The substrate includes a plurality of electrical traces connected to the die that are used to power the light emitting device. The housing includes a reflector having a reflective inner wall facing the die and an aperture through which light reflected from the inner wall exits the housing. The aperture lies in a plane normal to the top surface of the die and is less than 7 times the maximum dimension of the die. The die is encapsulated in a transparent layer of material. In one aspect of the invention, the substrate has a bottom surface that includes a plurality of surface electrodes, each electrode being connected to a corresponding one of the electrical traces. In another aspect of the invention, the substrate includes a dielectric layer sandwiched between the top and bottom metal layers, each of the layers having a thickness less than 200 µm. In another aspect of the invention, the housing includes a preformed structure bonded to the substrate.

DETAILED DESCRIPTION OF THE PREFERRED EMBODIMENTS OF THE INVENTION

For the purposes of the present discussion, the efficiency of a light source is defined to be the percentage of the electrical power applied to the light source to the power in the light that is delivered to the object being illuminated in the desired portion of the optical spectrum. Efficiency is particularly important in battery-powered portable devices because the power dissipated by the light source represents a significant fraction of the power consumed by the device, and hence, has a significant impact on the length of time the device will operate on a given battery. In addition, the efficiency of the LEDs has a direct impact on the number of LEDs that must be utilized, and hence, the cost of the light source, since a single LED is equivalent to an incandescent light bulb having a power rating of a few watts at most. Finally, the efficiency impacts the amount of heat that must be dissipated, since the energy that is not converted to light in a useful portion of the optical spectrum is converted to heat that must be moved to the surrounding environment.

Figure 1:
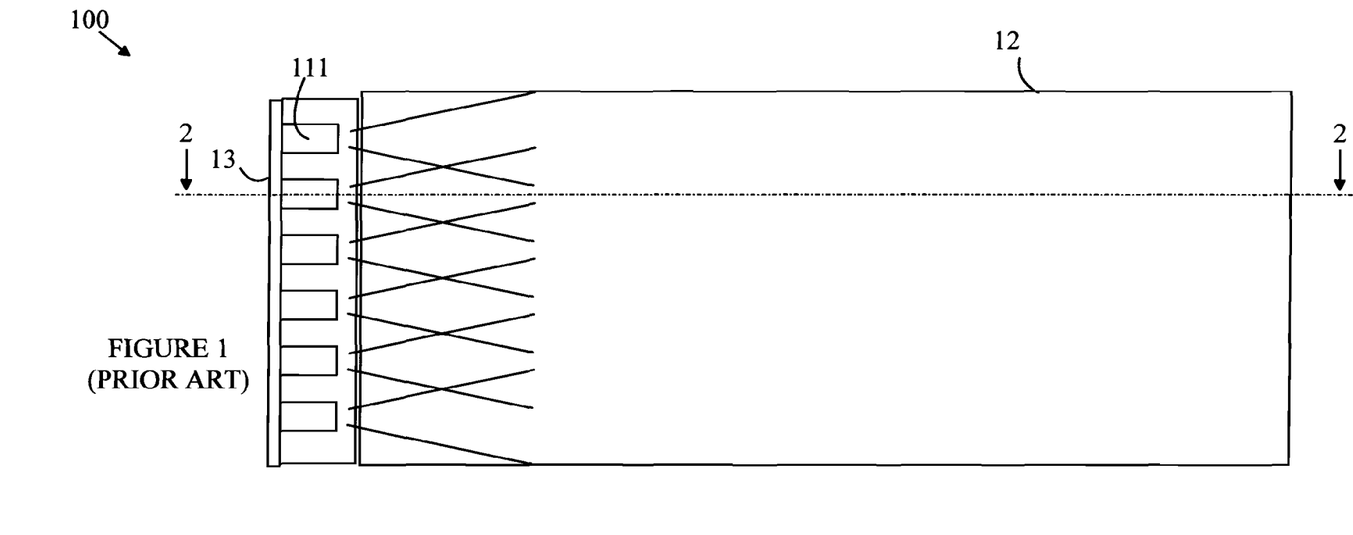
FIG. 1 is a top view of a prior art light source.
Figure 2:
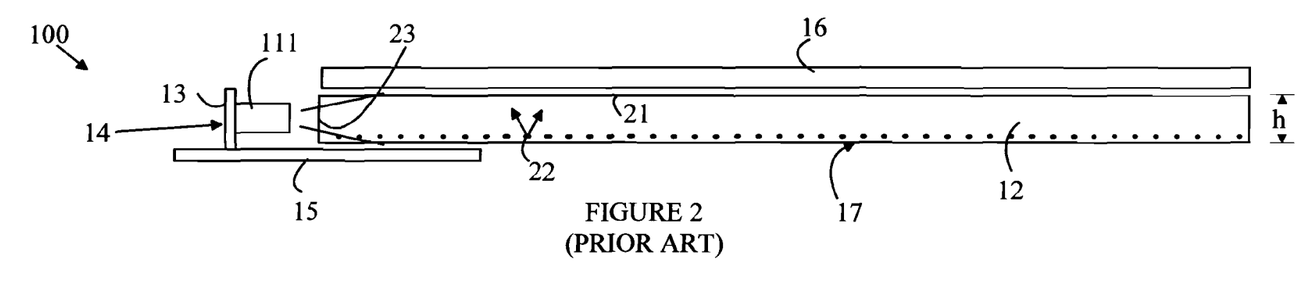
FIG. 2 is a cross-sectional view through line 2-2 shown in FIG. 1.

The manner in which the present invention provides its advantages can be more easily understood with reference to FIGS. 1 and 2, which illustrate a prior art light box arrangement for illuminating a transparency 16. FIG. 1 is a top view of light source 100 and FIG. 2 is a cross-sectional view of light source 100 through line 2-2 shown in FIG. 1. Light source 100 utilizes an array of LEDs 111 to illuminate a light pipe 12. The LEDs are mounted on a circuit board 13 that is mounted on a second board 15 that provides power to the LEDs. The LEDs are positioned such that light leaving the top of each LED illuminates the end of light pipe 12 through surface 23. The light entering light pipe 12 at an angle greater than the critical angle with respect to the normal of surface 21 is reflected back and forth within light pipe 12 until the light is either absorbed or scattered by particles 22 on surface 17. The scattered light that strikes surface 21 at angles less than the critical angle escapes from the light pipe and illuminates the back surface of transparency 16.

Figure 3:
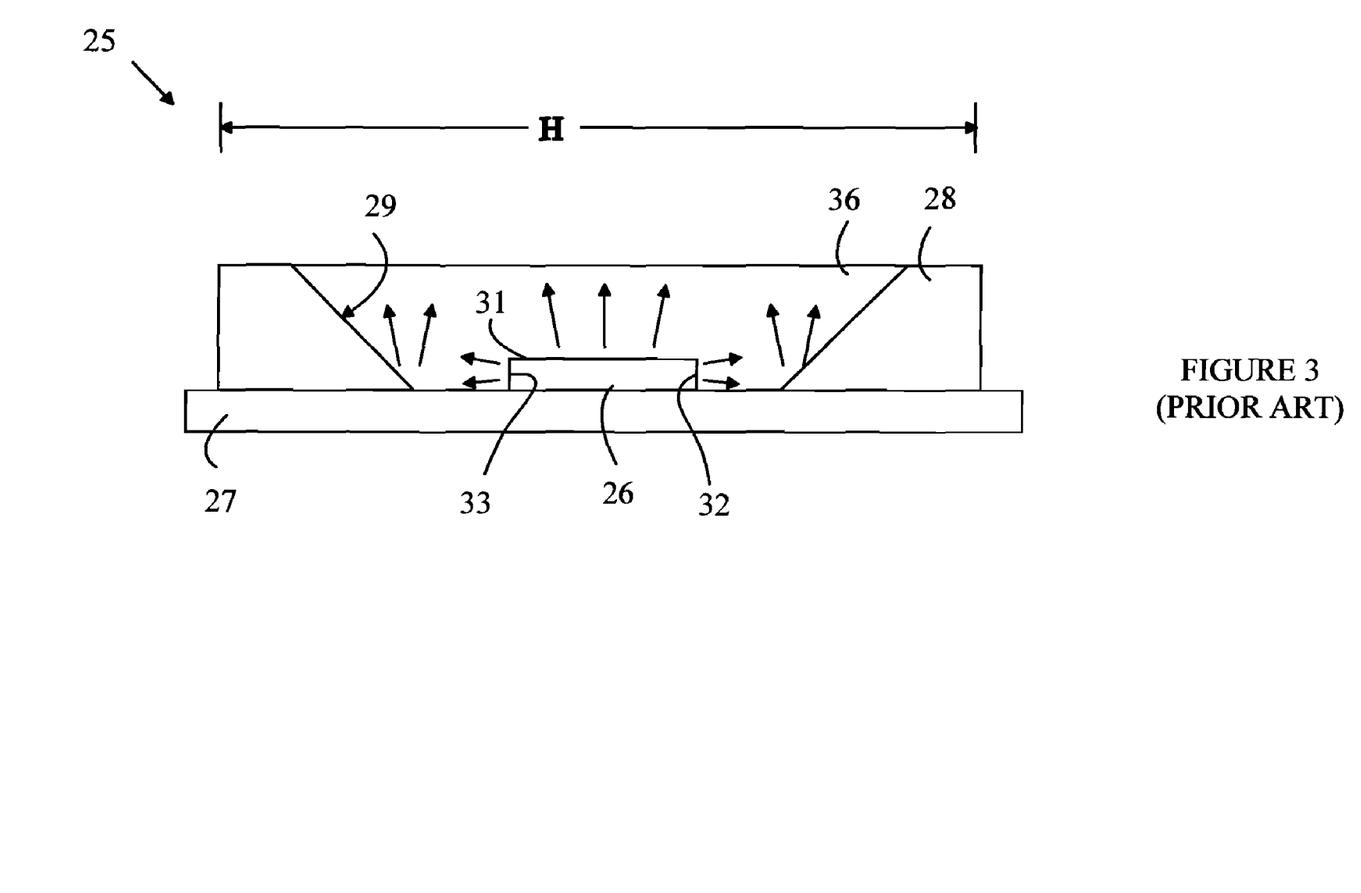
FIG. 3 is a cross-sectional view of another prior art light source.

To provide efficient injection of the light from the LEDs into light pipe 12, the height of the packaged LED must be less than the thickness of light pipe 12. As the thickness of light pipe 12 is reduced, this criterion is difficult to meet with conventionally packaged LEDs. Refer now to FIG. 3, which is a cross-sectional view of a prior art light source. Light source 25 includes a die 26 that is mounted on a substrate 27 within a reflector cup 28. The sides 29 of reflector cup 28 are coated with a reflective material. The power connections to die 26 are provided via substrate 27. To simplify the drawing, the connections between traces on substrate 27 and die 26 have been omitted. Die 26 includes an LED that emits light through the top surface 31 thereof and also through the side surfaces 32 and 33. The light emitted through the side surfaces is predominantly light that was trapped within the LED by internal reflection arising from the high index of refraction of the materials from which many LEDs of interest are constructed. Reflector cup 28 redirects this light such that it leaves the LED in directions similar to that of the light leaving surface 31. Reflector cup 28 is typically filled with a clear encapsulant 36 that protects the LED from the environment and improves the extraction of light from the die.

When used in a light source such as that shown in FIGS. 1 and 2, light source 25 is rotated 90 degrees and abutted to the edge of the light pipe. Hence, the minimum height, H, of light source 25 is determined by the width of reflector cup 28. The width, in turn, is determined by the width of the die, which depends on the power output of the LED and other parameters that are not easily changed. In general, the width of the reflector cup is several times the width of the die. Hence, there is a point at which H cannot be maintained less than or equal to the height of the light pipe, h. Typically, the smallest packaged die that can be economically fabricated has H greater than 0.6 mm. Hence, some other arrangement is needed when the thickness of the light pipe is below 1 mm.

Heat dissipation is also a problem in this type of light source. The heat generated by the LEDs must be dissipated either on the back surface 14 of printed circuit board 13 or by being conducted to printed circuit board 15. The area available for heat dissipation on surface 14 is limited by the height of printed circuit board 13, which has a maximum height determined by h. As the display thickness is reduced, this height must also be reduced. Alternatively, the heat can be conducted through printed circuit board 13 to printed circuit board 15 that has a larger area available for heat dissipation. However, the heat flow is restricted by the thickness of printed circuit board 13.

Figure 4:
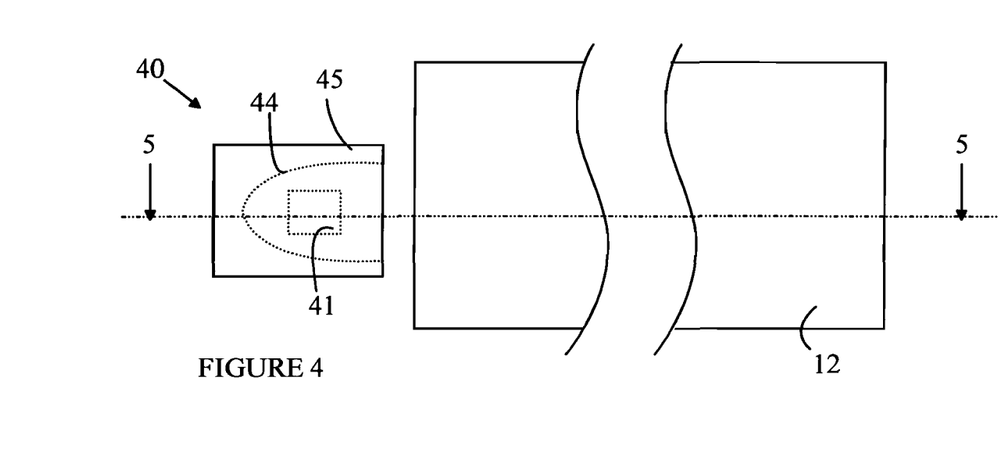
FIG. 4 is a top view of a light source according to one embodiment of the present invention positioned to inject light into a light pipe.
Figure 5:
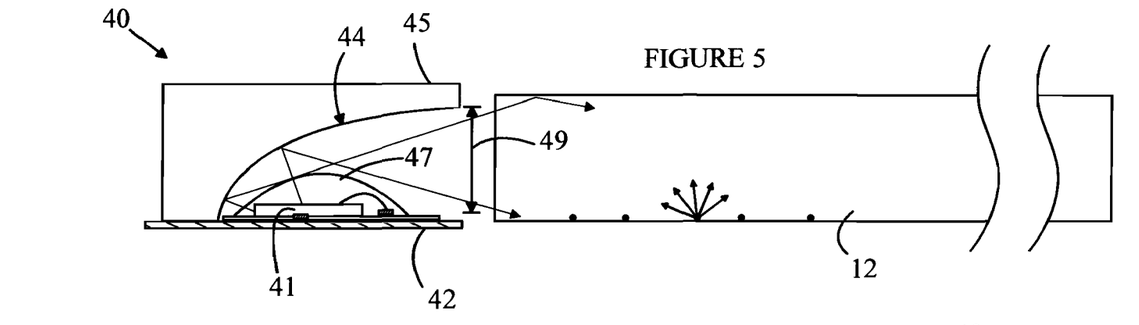
FIG. 5 is a cross-sectional view through line 5-5 shown in FIG. 4.
Figure 6:
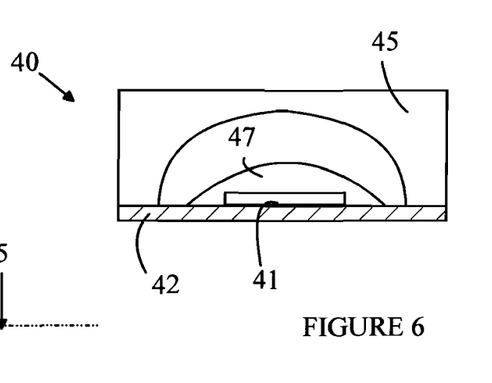
FIG. 6 is a front view of light source 40.

A light source according to the present invention overcomes these problems by utilizing a thin substrate and a reflector system that allows the LEDs to be mounted facing upwards. Refer now to FIGS. 4-6, which illustrate a light source according to one embodiment of the present invention. FIG. 4 is a top view of light source 40 positioned to inject light into a light pipe 12. FIG. 5 is a cross-sectional view through line 5-5 shown in FIG. 4, and FIG. 6 is a front view of light source 40. Light source 40 is constructed from a reflector 45 and an LED die 41 that is mounted on a circuit carrier 42. In this embodiment, it is assumed that the die is square and is characterized by a width and thickness. However, other shapes of dies could be utilized. In general, a different shaped die can be characterized by a thickness and maximum dimension. Here, the maximum dimension is the longest linear distance between two points on the die.

The details of the circuit carrier and mounting arrangements will be discussed in more detail below. For the purposes of the present discussion, it is sufficient to note that die 41 is connected to conductors in circuit carrier 42 and is covered by a layer of encapsulant 47 having a curved outer surface. The curved outer surface improves the light extraction efficiency from die 41.

Reflector 45 has an inner surface 44 that redirects light leaving the top and sides of die 41 such that the light enters the edge of light pipe 12 within the proper cone of angles to be trapped by internal reflection until the light is scattered in a manner analogous to that discussed above. The surface is rendered reflective by coating the surface with a reflective metal coating or by utilizing a material that is already reflective. As will be discussed in more detail below, the reflector can be constructed from a preformed plastic molding or a machined metallic part. In embodiments in which reflector 45 is metallic, the reflector can also provide a heat sinking and heat dissipation function.

As noted above, the shape of surface 44 is set such that light from die 41 is redirected into the edge of light pipe 12. Non-imaging optical reflectors for providing this function are known to the art, and hence, will not be discussed in detail here. Surfaces that are shaped to provide compound parabolic or hyperbolic reflectors are particularly useful in this regard. However, simple parabolic surfaces or other shapes can be used and still provide high light coupling efficiency between the light leaving die 41 and light pipe 12.

The preferred reflector shape collects as much light from the side surfaces of the dies as possible. A rectangular die has four side surfaces that could, in principle, emit light. One of these surfaces faces the exit aperture, and hence, that light exits the light source without the need to provide a reflective surface to facilitate the extraction of that light. Light from the remaining sides is collected by providing reflective surfaces. The reflective surfaces should be shaped such that light from the sides of the die is redirected through the aperture. Consider the cross-section of the aperture in a plane that is parallel to the top of the die and located at a height above the substrate equal to half of the die thickness. If the cross-section opposite the side of the die is a line parallel to the side of the die, the reflector is, in effect, a plane mirror, and will be inefficient at imaging the light into the aperture. In fact, the half of the light leaving the side in a direction away from the aperture will be lost in such an arrangement. Hence, the cross-section in question preferably should not be rectangular with a side parallel to the sides of the die. In general, a reflector shape in which the cross-sections are open concave curves in planes that are parallel to the top surfaces of the dies is preferred. The opening in each of the concave curves increases in size as a function of the distance between the die and the aperture.

It should be noted that the minimum height for aperture 49 of light source 40 is determined by the thickness of die 41 rather than the maximum dimension of die 41. Hence, embodiments of light sources according to the present invention can be constructed with significantly smaller vertical heights than conventional light sources of the type discussed above. In addition, a light source according to the present invention can be constructed utilizing mass production techniques that significantly lower the cost of production below that experienced in manufacturing conventional side emitting light sources.

In one embodiment of the present invention, the light source is constructed on a thin substrate. The thickness of the substrate is particularly important in embodiments adapted for thin light pipes, since the height of the substrate also adds to the height of the final light source. In addition, the thin substrates utilized are relatively inexpensive and provide good heat transfer properties.

It should also be noted that the area that is available for heat transfer between the die and the underlying printed circuit board on which the light source is mounted is not restricted to the thickness of the mounting substrate as in the prior art devices discussed above. The surface area on the bottom of a light source according to the present invention can be made as large as required without altering the height of the aperture.

Figure 7:
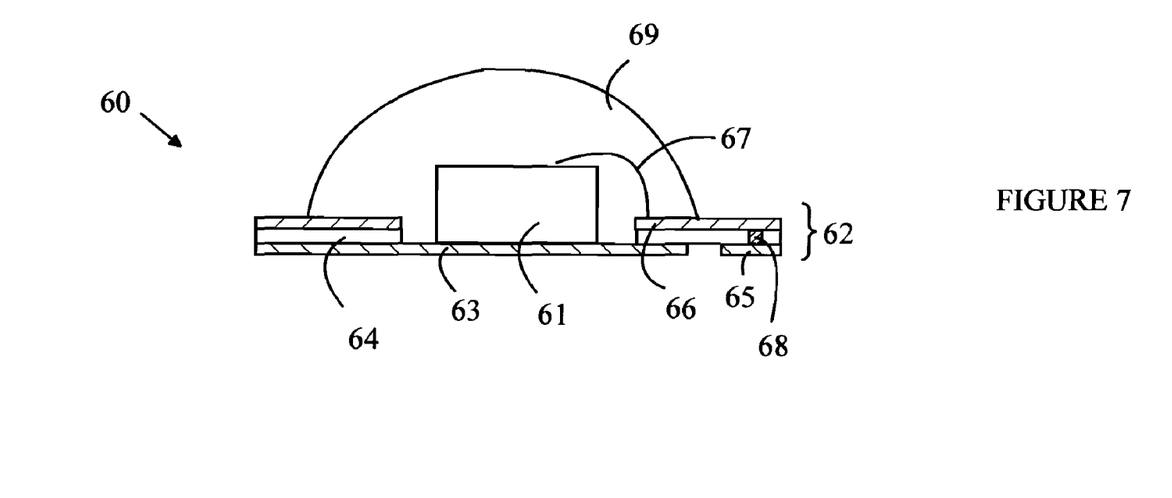
FIG. 7 is a cross-sectional view of a light source that can be utilized to construct one embodiment of the present invention.

Refer now to FIG. 7, which is a cross-sectional view of a light source 60 that can be utilized to construct one embodiment of the present invention. Light source 60 utilizes a die 61 that contains an LED. Die 61 is mounted on a carrier 62 and covered with an encapsulating dome 69.

Carrier 62 is constructed from an insulating substrate 64 that has two layers of metal deposited on opposite sides of substrate 64. Both of these layers are patterned to provide the various traces needed to connect and power die 61. Die 61 is mounted on and, connected electrically to, a pad 63 that is formed from the bottom metal layer 63. Pad 63 is used to provide one of the power connections to die 61. The other power terminal of die 61 is on the top of die 61 and is connected to a trace 66 by a wire bond 67. Trace 66 is connected to a trace 65 in the bottom metal layer by a conducting via 68. Trace 65 is electrically isolated from the pad on which die 61 is mounted. Hence, light source 60 can be surface mounted on a printed circuit board or the like.

Die 61 and wire bond 67 are encapsulated in the dome-shaped layer of encapsulant that protects die 61 from the environment. The encapsulating material is transparent to the wavelengths of light generated by the light source. The encapsulating layer can also be used as a carrier for phosphor particles or other luminescent materials in light sources based on phosphor conversion of the light from die 61.

The encapsulant layer also improves the efficiency with which light is extracted from the die. LEDs are constructed from materials that often have very high indices of refraction relative to the surrounding environment. As a result, light generated in the LED tends to be trapped by internal reflection in a manner analogous to that described above for light in the light pipe. The encapsulating layer increases the amount of light that can escape the high index of refraction medium by providing an environment that has an index of refraction that is intermediate between that of the LED and that of air. In addition, the curved surface increases the amount of light that leaves the LED and strikes the surface at angles less than the critical angle, and hence, can escape the encapsulation layer.

In one embodiment, carrier 62 is constructed from a flexible printed circuit carrier. Flexible circuit carriers constructed using polyamide-based insulating layers are available commercially from Dupont. The insulating layer is provided with a copper layer on the top and bottom surfaces thereof. The top and bottom surfaces can be lithographically patterned to provide the various traces in a manner analogous to that used with conventional printed circuit boards. The dielectric layer is preferably between 10 µm and 200 µm. The metal layers are preferably between 2 µm and 200 µm.

Figure 8:
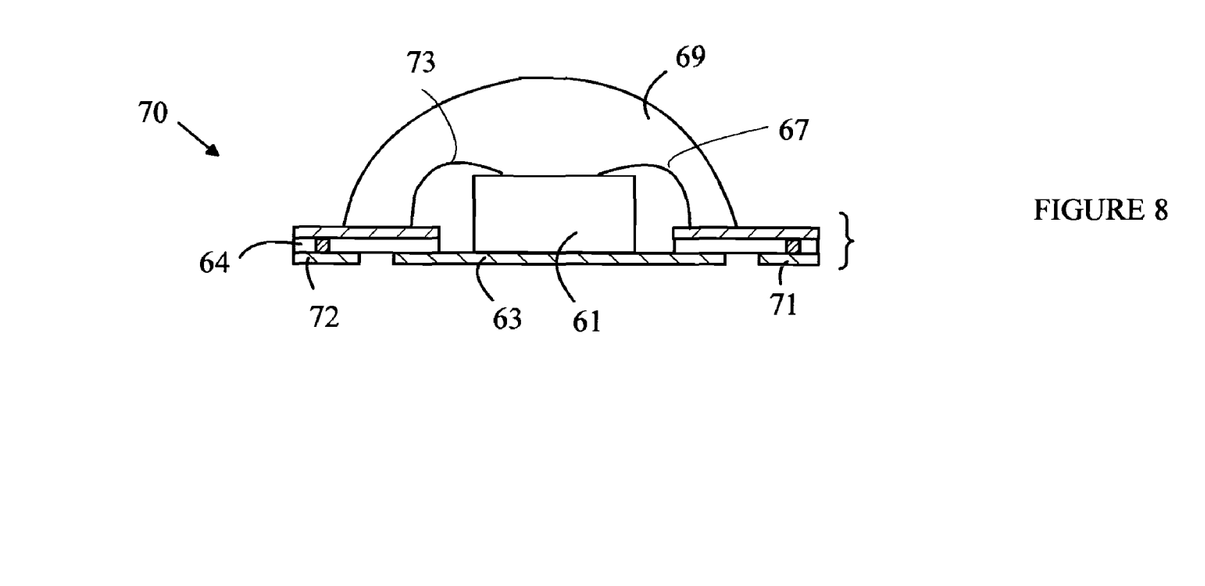
FIG. 8 is a cross-sectional view of a light source that can be utilized to construct one embodiment of the present invention.

The above-described embodiments utilize a connection arrangement in which the die has one power contact on top of the die and one contact on the bottom of the die. However, other connection arrangements could also be utilized by appropriately patterning the top and bottom metal layers. Refer now to FIG. 8, which is a cross-sectional view of a light source 70 that can be utilized to construct one embodiment of the present invention. Light source 70 is similar to light source 60 discussed above. Light source 70 differs from light source 60 in that both power terminals are on the top of die 61 and these terminals are connected to separate traces in the top metal layer by wire bonds 67 and 73. In this case, bottom contact 65 provides a heat path, but not an electrical connection. The traces in the top metal layer could also be connected to pads 71 and 72 in the bottom metal layer for surface mounting by conducting vias.

Figure 9:
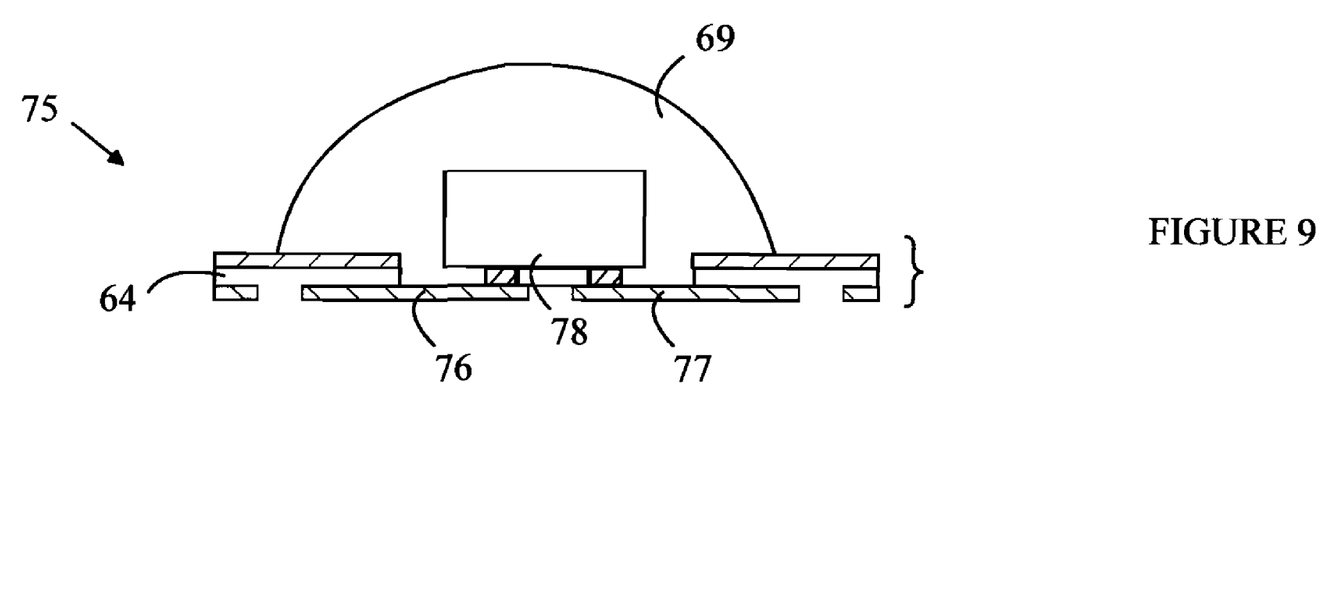
FIG. 9 is a cross-sectional view of a light source that can be utilized to construct one embodiment of the present invention.

In addition, connection arrangements in which the die is a surface-mounting die with power contacts on the bottom surface of the die can also be accommodated. Such power contacts are commonly known as and may be referred to herein as "surface electrodes". Refer now to FIG. 9, which is a cross-sectional view of a light source 75 that can be utilized to construct one embodiment of the present invention. Light source 75 utilizes a surface-mounting die 78 that has power contacts on the bottom surface. The bottom metal layer is patterned to provide two corresponding pads 76 and 77 that are bonded to these contacts and provide surface mount contacts under the packaged light source.

It should be noted that the cavity in the reflectors is concave and well adapted to fabrication by molding. In fact, a sheet of cavities could be molded from a suitable plastic and the molded surface rendered reflective by applying a reflective metal coating. Similarly, a sheet of reflectors could be fabricated by machining or pressing a sheet of metal against a mold.

Figure 10:
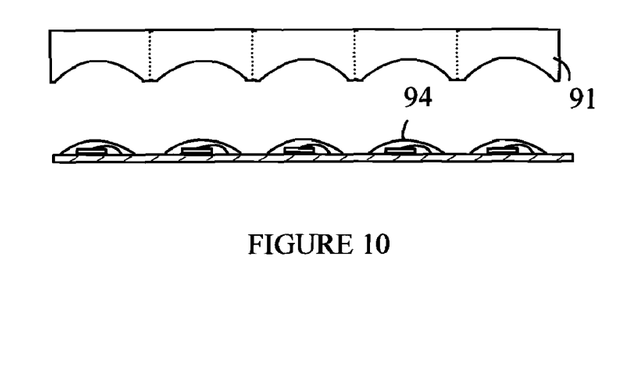
FIG. 10 is a cross-sectional view of the sheets shown in FIG. 12 through line 10-10.
Figure 11:
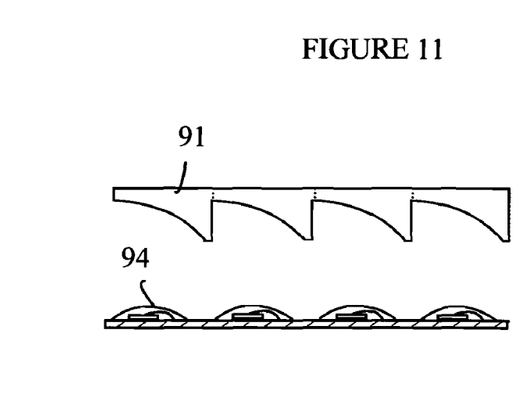
FIG. 11 is a cross-sectional view of the sheets shown in FIG. 12 through line 11-11.
Figure 12:
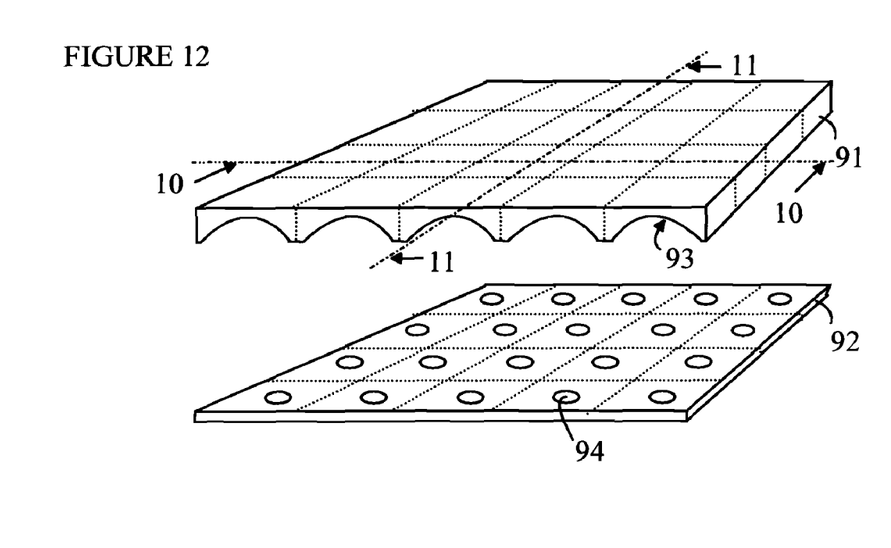
FIG. 12 is a perspective view of a sheet of reflectors positioned over a sheet of mounted dies prior to bonding the sheets together.
Figure 13:
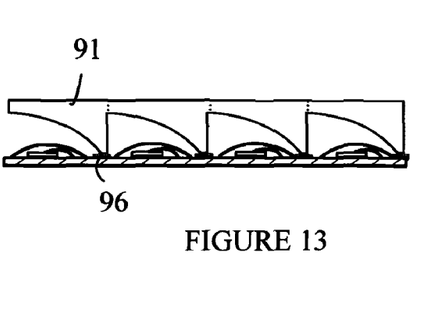
FIG. 13 is a cross-sectional view of the sheets after bonding.

Refer now to FIGS. 10-13, which illustrate the manner in which light sources are fabricated according to one embodiment of the present invention. FIG. 12 is a perspective view of a sheet of reflectors positioned over a sheet of mounted dies prior to bonding the sheets together. FIG. 10 is a cross-sectional view of the sheets shown in FIG. 12 through line 10-10, and FIG. 11 is a cross-sectional view of the sheets shown in FIG. 12 through line 11-11. FIG. 13 is a cross-sectional view of the sheets after bonding. The process begins by fabricating a sheet 92 of mounted dies 94. Each die is mounted to a circuit carrier and encapsulated in a manner similar to that discussed above. Sheet 92 is a two-dimensional array of dies mounted on a large sheet of the circuit carrier.

After the dies are mounted and encapsulated as shown at 94, a corresponding sheet 91 of reflectors 93 is positioned over the sheet of dies. The sheets are then bonded together using a suitable adhesive 96. The bonded sheets are then cut along the dotted lines shown in the figures to separate the individual light sources.

The above-described embodiments of the present invention utilize an arrangement in which a single die is encapsulated in each light source. However, embodiments in which a plurality of dies is incorporated under a single reflector could also be constructed. That is, a plurality of dies could be included under the encapsulation layer shown at 94 in each of the light sources.

Figure 14:
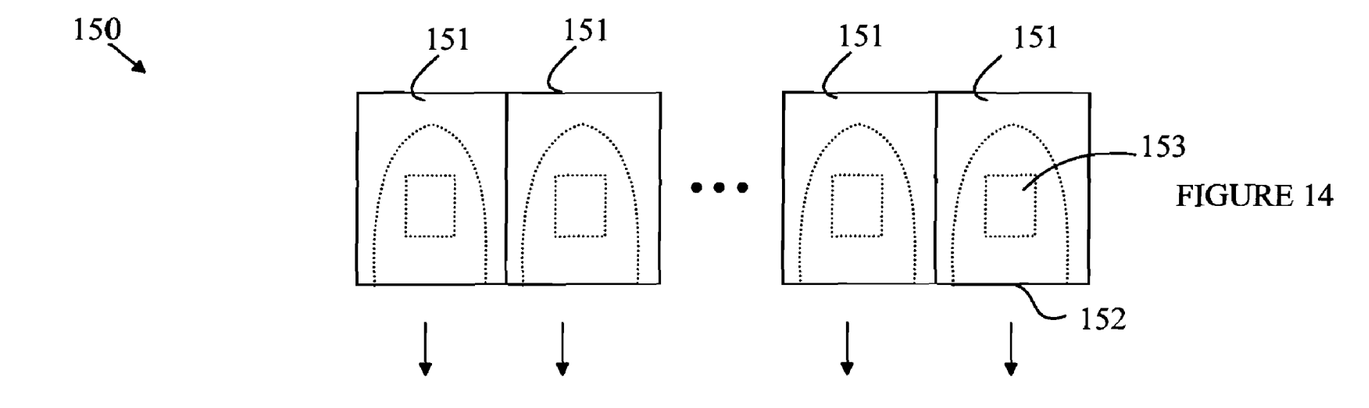
FIGS. 14 and 15 illustrate a linear light source according to one embodiment of the present invention
Figure 15:
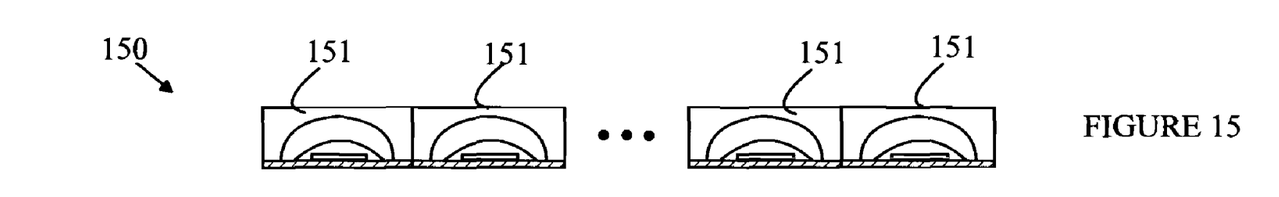

It should also be noted that the sheet of dies can be cut in a manner that provides a long thin light source of any desired length that is less than a maximum size that depends on the dimensions of the sheet. Refer now to FIGS. 14 and 15, which illustrate a linear light source according to one embodiment of the present invention. FIG. 14 is a top view of light source 150, and FIG. 15 is a front view of light source 150. Light source 150 includes a plurality of packaged LEDs 151 in which each package includes one or more LEDs 153 in an encapsulating layer that are located within a reflector that directs the light through the aperture 152 of the housing in which the LEDs are located. Hence, light sources with multiple LEDs that are configured to illuminate the edge of an extended light source can also be constructed. In this arrangement, the die, or dies, under each reflector are optically isolated from the die or dies under other reflectors.

The above-described embodiments utilize dies that have LEDs fabricated therein. However, the present invention could be practiced with other forms of semiconductor light-emitting devices such as laser.

Various modifications to the present invention will become apparent to those skilled in the art from the foregoing description and accompanying drawings. Accordingly, the present invention is to be limited solely by the scope of the following claims.

What is claimed is:

1. A light source comprising:
   a die having a semiconducting light emitting device thereon, said die having a top surface, a bottom surface opposite said top surface, and a plurality of side surfaces, light being emitted through said top surface of said die, said die being characterized by a maximum dimension;
   a substrate having a top surface bonded to said bottom surface of said die, said substrate comprising a plurality of electrical traces connected to said die; and
   a housing surrounding said die, said housing comprising a reflector having a reflective inner wall facing said top surface and at least two of said plurality of side surfaces of said die and an aperture through which light reflected from said inner wall exits said housing, said aperture lying in a plane normal to said top surface and adjacent to one of said side surfaces of said die, said die being encapsulated in a transparent layer of material.

2. The light source of claim 1 wherein said aperture has a height less than 7 times said maximum dimension of said die.

3. The light source of claim 1 wherein said substrate has a bottom surface comprising a plurality of surface electrodes, each electrode being connected to a corresponding one of said electrical traces.

4. The light source of claim 1 wherein said substrate comprises a dielectric layer sandwiched between top and bottom metal layers, each of said layers having a thickness less than 200 μm.

5. The light source of claim 1 wherein said housing comprises a preformed structure bonded to said substrate.

6. The light source of claim 1 wherein said reflector comprises a compound parabolic or hyperbolic surface.

7. The light source of claim 1 wherein said plurality of side surfaces of said die comprise first, second, and third side surfaces through which said die emits light and wherein said reflector faces said first, second and third side surfaces and reflects light therefrom such that said light exits said light source through said aperture, and wherein said aperture faces a fourth side surface of said plurality of side surfaces.

8. A light source comprising:
   a plurality of dies connected together to form a linear array of packaged dies connected to a circuit carrier that is common to all of said packaged dies, said circuit carrier having a plurality of electrical traces, each die comprising a semiconducting light emitting device, said die having a top surface, a bottom surface opposite said top surface, and a plurality of side surfaces, light being emitted through said top surface of said die, said die being connected to first and second ones of said electrical traces; and
   a housing surrounding said plurality of dies, said housing comprising a plurality of reflectors arranged in a linear array, one reflector corresponding to each of said dies, each reflector having a reflective inner wall facing said top surface and at least two of said plurality of side surfaces of said die and an aperture through which light reflected from said inner wall exits said housing, said aperture lying in a plane normal to said top surface and adjacent to one of said side surfaces of said die, wherein each die is optically isolated from the others of said dies corresponding to different reflectors in said light source.

* * * * *